(12) United States Patent
Morioka et al.

(10) Patent No.: US 6,721,919 B1
(45) Date of Patent: Apr. 13, 2004

(54) SHARED ENCODER USED IN ERROR CORRECTION HAVING MULTIPLE ENCODERS OF DIFFERENT MAXIMUM ERROR CORRECTION CAPABILITIES

(75) Inventors: Sumio Morioka, Yamato (JP); Yasunao Katayama, Hachiohji (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/544,395

(22) Filed: Apr. 6, 2000

(30) Foreign Application Priority Data

Apr. 6, 1999 (JP) .......................... 11-098647

(51) Int. Cl.[7] .................. G06F 11/00; H03M 13/00; H03M 13/11
(52) U.S. Cl. .................. 714/801; 714/781; 714/758
(58) Field of Search ................ 714/755, 758, 714/779, 781, 801

(56) References Cited

U.S. PATENT DOCUMENTS 5,469,448 A * 11/1995 Denissen et al. ........... 714/755
5,787,099 A * 7/1998 Lan et al. ................... 714/781
5,856,987 A * 1/1999 Holman ..................... 714/752

OTHER PUBLICATIONS

"Constuctions of perfect mixed codes and other covering codes", Etzion et al., IEEE Trans. Inform. Theory, vol. 39, pp. 209–214, 1993.*

"Reliability–based Syndrome Decoding of Linear Block Codes" by Fossorier et al., IEEE Transaction on Information Theory, vol.: 44 Issue: 1, Jan. 1998 Page(s): 388–398.*

* cited by examiner

*Primary Examiner*—Albert Decady
*Assistant Examiner*—Cynthia Britt
(74) *Attorney, Agent, or Firm*—Robert A. Walsh

(57) ABSTRACT

A system having multiple encoders of different maximum error correction capability, which reduces the entire size of the system by allowing most of the system to be shared among these encoders. This is accomplished by using an encoder that is capable of calculating parities of 2 or more kinds of bit numbers with different error correction capability. The system includes a circuit that generates a modified word by assigning a predetermined value to input an information word; and a circuit that generates an intermediate signal "u" by a linear operation using a modified word and matrix "P". These circuits are combined with linear operation circuits for generating value of parity $p_1, \ldots, p_\alpha$, each of whose bit number is different, by a linear operation using all or part of the intermediate signal and matrixes $Q_1, \ldots, Q_\alpha$ respectively.

22 Claims, 3 Drawing Sheets

SHARED ENCODER USED IN ERROR CORRECTION HAVING MULTIPLE ENCODERS OF DIFFERENT MAXIMUM ERROR CORRECTION CAPABILITIES

FIELD OF THE INVENTION

The present invention relates to the circuit having encoder and decoder of error correction codes.

BACKGROUND OF THE INVENTION

Many error correction codes (ECC) currently used consist of linear codes or systematic codes. Systematic code is a category of code where data to be sent has a form of "original data +parity," which is used in many application ECCs. These codes for ECC applications also incorporate Galois field or Galois extension fields which are a kind of number system used in the code.

For purposes of explanation of this invention it should be understood that word symbol length n (a symbol is data of 1 bit or multiple bits put together in a lump, and used as a synonym of byte or word), information word (message word or data word) symbol length k, generator matrix G (a matrix for calculating a parity by matrix operation on encoder) of linear code (n, k) on Galois extension field GF ($2^m$) of m-bit symbol length or Galois field GF (2), and parity check matrix H (a matrix for calculating a syndrome on decoder), where G is a k×n matrix, and H is a (n−k)×n matrix. The syndrome information shows what and where an error has occurred in the data that must be calculated in a decoder.

An encoding calculation is performed for acquiring vG for the information word v (km bit) of symbol length k, and syndrome calculation in decoding is performed for acquiring $wH^T$ for received word w (nm bit) of symbol length n (where $H^T$ is a matrix of H). The above two calculations are both linear operations performed on GF ($2^m$) or GF (2), and normally rendered a circuit by combining XOR gates in the form of XOR calculation. Each row vector of G and each row vector of H are linearly independent on GF ($2^m$) or GF (2) respectively.

Systematic code includes the original information word in symbol k portion and also includes a parity word in the remaining symbol n−k portion.

In linear code and systematic code, of generator matrix of k×n matrix, the k×k area forms a unit matrix to embed an information word in the code word so that the process substantially performed in the encoder is applied only to an information word k×(n−k) matrix, of the generator matrix of k×n matrix, which generates a parity word. In the following description this k×(n−k) matrix will be referred to as G.

Depending on what circuit encodes and what syndrome calculation are to be performed, will determine whether the information word or received word is serial or parallel mode. If it is serial, it is implemented in a sequential circuit by using LFSR (Linear Feedback Shift Register, a kind of a shift register), etc. If the entire information word is in parallel mode, the word is encoded or decoded in parallel (hereafter, "parallel encoding/decoding"), it is implemented in a combinational circuit.

In the case where a decoder is implemented not in parallel encoding/decoding but in a sequential circuit (syndrome calculation and Chien search, for instance, are similar in circuit configuration) a method of sharing a register may be used. These are described in "Circuit for Generating Polynomials for Error Correction Calculation" (Japanese Unexamined Patent Publication No. Hei 3-190326), "Reed-Solomon Circuit for Decoding Error Correction Code" (Japanese Unexamined Patent Publication No. Hei 8-139612), and the following document: "An Area-Efficient VLSI Architecture of a Reed-Solomon Decoder/Encoder for Digital VCRs," S. Kwon and H. Shin, IEEE trans. on Consumer Electronics, Vol.43, No.4, pp.1019–1027, November, 1997, etc.

In a combinational circuit, coordination of common portions (so called "Resource Sharing") among multioutput logic functions includes a circuit design which performs the same calculation as separate circuits of the same system that are put together to act like a single circuit.

The method for using a decoder as an encoder for Reed-Solomon code is described in , "Use of the RS Decoder as an RS Encoder for Two Way Digital Communications and Storage Systems," C. C. Hsu, I. S. Reed, and T. K. Truong, IEEE Transactions on Circuits and Systems for Video Technology, Vol.4, No.1, pp.91–92, February, 1994.

According to this article, it is a prerequisite to use a decoder with an erasure decoding feature, and indicates that it is difficult in a code such as Reed-Solomon code to correct erasure with parallel code. The problem in such a method is that encoding takes as long a time as decoding.

Parallel encoding/decoding is performed in the case where high speed is required and data is in parallel mode. For example, in a memory system where:

(i) Error correction circuit of high speed and low power consumption for extending DRAM refresh time (QNVRAM)

where coordination of a group of encoders will be effective. Codes of different error correction capability should be concurrently used in order to improve flexibility and reliability of the system. (For example, see the specification of Japanese Unexamined Patent Publication No. Hei 10-13586.)

(ii) Error correction circuit for computer main storage that requires reliability (Memory ECC), where ECC is applied to memory in parallel encoding/decoding. In which case, the encoding should be performed at a high speed while error correction is slow.

(iii) Error correction code is used in a multiple manner in order to improve error correction capability, and if a high-speed decoding process is required in spite of originally slow data transfer speed.

For instance, in a future high-speed communication, etc. where there may arise the necessity to decrease packet retransmission by using a powerful ECC or to dynamically change error correction capability according to the situation, then effective coordination of a group of encoders is necessary.

Implementation of such parallel encoding/decoding circuit is equal to implementing a combinational circuit by deploying a sequential circuit, which generally makes circuit size much larger even though it depends on input word length and error correction capability. Thus, such parallel encoding/decoding could be performed only to code of low error correction capability. However, as implementable circuit size has increased in recent years, code allowing parallel encoding/decoding has also increased, heightening the importance of holding down the circuit size.

Also, each encoder must be made separately because the circuits of different error correction capability create the problem of a circuit becoming too large.

In addition, if information word length (data length) increases, it causes the corresponding problem of circuit size increasing.

SUMMARY OF THE INVENTION

An objective of the present invention is to improve a system having multiple encoders with varying maximum error correction capability, while reducing the size of the circuit by allowing most of the system to be shared among these encoders.

Another objective is to reduce the size of the system (combining encoders and decoders) by integrating circuits for parallel encoding/decoding and allowing sharing of most of the encoders and most of the syndrome generator in the decoders.

Further objective is to reduce the size of the circuit by holding down the extent of increase of the scale of the circuit even if information word length, (ie data length) has increased.

To attain these objectives, the present invention offers the following circuit.

An encoder capable of calculating parities of $\alpha$ (where, $\alpha$ is an integer of 2 or more) kinds of bit numbers with different error correction capability, comprising: a first circuit for generating a modified word by assigning a predetermined value to the input information word; a first circuit connected to the first circuit for generating intermediate signal "u" by linear operation using the modified word and matrix "P"; and a second circuit connected to the first circuit all or part of the intermediate signal and matrixes $Q_1, \ldots, Q_\alpha$ respectively.

A circuit having a single encoder and decoder capable of calculating parities of $\alpha$ (here, $\alpha$ is an integer of 1 or more) kinds of bit numbers with different error correction capability. The circuit comprising: a first circuit that generates a modified word by assigning a predetermined value if the input message is an information word without any parity; a second circuit is connected to the first circuit that generates an intermediate signal by linear operation using the modified word and matrix P; a third circuit connected to the second circuit that generates a syndrome value of $s_1, \ldots, s_\alpha$, by linear operation using all or part of the intermediate signal and matrixes $R_1, \ldots, R_\alpha$ respectively; and a fourth circuit connected to the second circuit having an $\alpha$ linear operation that generates a value of parity $p_1, \ldots, p_\alpha$, each of whose bit number is different, by linear operation using all or part of the intermediate signal and matrixes $Q_1, \ldots, Q_\alpha$.

A circuit having a single encoder and decoder capable of calculating parities of $\alpha$ (here, $\alpha$ is an integer of 1 or more) kinds of bit numbers with different error correction capability. The circuit comprising: a first circuit that generates a modified word by assigning a predetermined value if the input message is an information word without any parity; a second circuit connected to the first circuit that generates an intermediate signal by linear operation using the modified word and matrix P; a third circuit connected to the second circuit that generates a all or part of the intermediate signal and matrixes R; and a fourth circuit connected to the second circuit having an $\alpha$ linear operation that generates a value of parity $p_1, \ldots, p_\alpha$, each of whose bit number is different, by linear operation using all or part of the intermediate signal and matrixes $Q_1, \ldots, Q_\alpha$.

A circuit having a single encoder and decoder capable of calculating parities of $\alpha$ (here, $\alpha$ is an integer of 1 or more) kinds of bit numbers with different error correction capability. The circuit comprising: a first circuit that generates a modified word by assigning predetermined value if input message is information word without any parity; a second circuit connected to the first circuit that generates an intermediate signal by linear operation using the modified word and matrix P, the intermediate signal being syndrome value of $s_1, \ldots, s_\alpha$ if the input message is received word; and a second circuit connected to the first linear operation circuit having $\alpha$ linear operation circuits for generating value of parity $p_1, \ldots, p_\alpha$, each of whose bit number is different, by linear operation using all or part of the intermediate signal and matrixes $Q_1, \ldots, Q_\alpha$ respectively.

DESCRIPTION OF THE PREFERRED EMBODIMENT

The present invention uses the Reed-Solomon code as a representative of the error correction code (ECC); however, it is not limited to only Reed-Solomon code. The ECC may be accomplished using error correction code C which is (n, k) linear code (m≧1, n>k≧1) as well as systematic code on Galois field GF ($2^m$) or Galois field GF (2).

The present invention may be used for error correction code C in the case of implementing in one system both an encoder (a sender of data calculating parities and attaching them to data) and decoders (receiver of data correcting errors of data) of a different number of parities or for implementing only multiple encoders.

Moreover, it is normal with conventional error correction code that data comes in serially one by one whereas, in the present invention, multiple pieces of data are input simultaneously utilzing parallel encoding/decoding (parallel proccessing). The greater amount of parallel processing (how many pieces of data processed simultaneously) increases the effectiveness.

Figure 1:
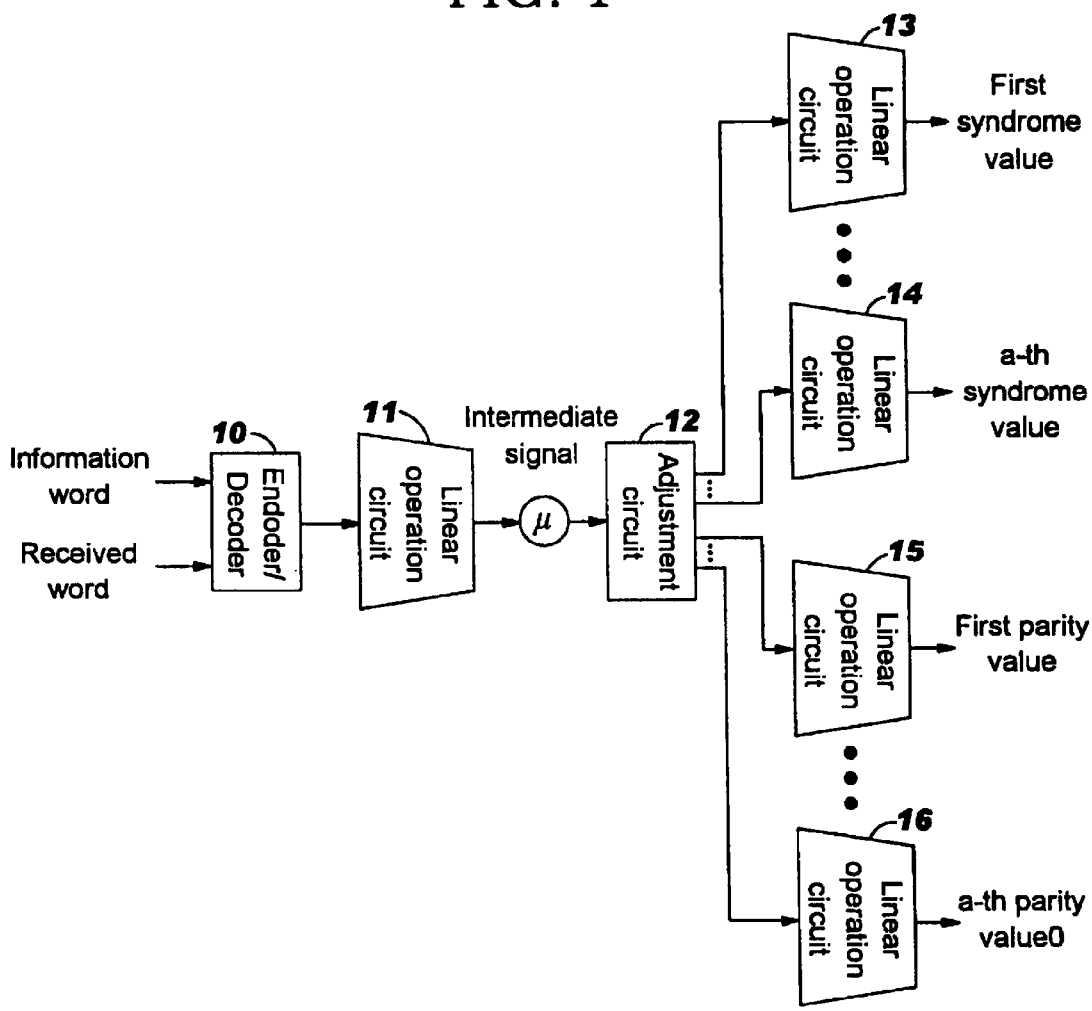
FIG. 1 is a block diagram showing the circuit of the present invention.

The outline of the circuit configuration for parallel encoding/decoding proposed by the present invention is shown in FIG. 1. First, there are two kinds of input message: (1) An information word which is km bit long and is data to be input when encoding, and (2) a received word which is nm bit long which is input when decoding and is also "original data (information word)+parity" that is sent through the transmission line. The received word may contain a few errors in the process of passing through the transmission line. If the input message is an information word, a predetermined value is assigned via circuit 10. Here, the bit length of the predetermined value to be assigned is either the same length as or larger than the sought value of parity of the largest bit length. Then, the data of this information word with predetermined value assigned, or the data as is if input message is received word, or the data of the received word with predetermined value is assigned (the present invention refers to such data output from another circuit as a "modified word") if necessary to make an invariant in the bit number of data to be input in a linear operation circuit, is input in linear operation circuit 11. The linear operation is then performed by using a predetermined matrix to calculate an intermediate signal u.

Here, the intermediate signal u is characterized by having a smaller bit length than the modified word to be input into the linear operation circuit 11, which is equal to or larger than the largest bit length of value of parity. Such intermediate signal u is used to narrow the bit width. Therefore, the number of circuits can be significantly reduced by not using the input information word and received word for parity calculation or syndrome calculation but rather using an intermediate signal of smaller bit length than those to further acquire value of parity.

Next, a linear operation on GF (2) or GF ($2^m$) is performed for intermediate signal u by linear operation circuit 13 or 16 to generate a code word and syndrome as output. This generally means to review the content of the linear operation not only at a byte level or a word level but also at a bit level. Generally, the degree of optimization will be higher by working at a bit level.

The encoding and syndrome generation, having different maximum error correction capability, are performed by linear operation for all and/or part of the intermediate signal u using linear operation circuit 13, 14 and 15 respectively. Here, α is the number of parities corresponding to different error correction capability. At this time, bit numbers of the 14, etc. are adjusted through an adjustment circuit 12 by using a predetermined value according to each linear operation circuit.

Here, it is possible to significantly reduce the number of circuits by using a square matrix for a matrix used on linear operation circuits 14, 15, etc. by calculating parities.

Moreover, calculation of intermediate information or circuit output is not limited to linear operation performed on GF ($2^m$) but can also be linear operation performed on GF (2). This also effectively reduces the gate number.

Multiple codes provide different error correction capability as well as different information word lengths (incoming data length) which can be supported using this circuit configuration. An unused bit of circuit input is made by a predetermined value, which is an equivalent to maximum length of data provided to the circuit input, and in the case of handling short length of data, a 0 is used as the remaining bit. If the input message to circuit 10 is an information word without any parity or a received word of which the bit number is less than received word of the largest length, bit sequence $c_1, \ldots, c_{2\alpha}$ (length is 0 bit or more) of maximum 2α kinds of predetermined value is assigning to an appropriate position in such word so that it will be a word of the same bit number whatever the case may be.

Circuit 11 performs a linear operation on Galois field on a word of a certain bit number acquired by assigning the predetermined value to information word if the input message is an information word without any parity, or on a word of a certain bit number acquired by assigning the predetermined value to the received word according to necessity if the input message is a received word with parity, using matrix P so as to generate a certain intermediate signal u.

Then, a linear operation on Galois field is performed by linear operation circuit 13 for bit sequence of all or part of the intermediate signal u to generate a syndrome value s; and a linear operation is performed by linear operation circuit 14 to generate a value of parity whose bit number is different. Depending on necessity, the bit number is adjusted by adjustment circuit 12.

As stated above, the present invention is different in principle from merely integrating common portions of the circuit. Merely integrating common portions of the circuit would not result in this reduction of scale of the circuit.

Furthermore, from the viewpoint of logic optimization techniques, and of basic properties of XOR calculation, this approach uses a property not used for integrating common portions, so it is difficult in principle to produce the same effect merely by integrating common portions. Specifically, in the case of integrating common portions, the circuit configuration acquired in the present invention cannot be derived in principle. While the output of a circuit, in any circuit, is XOR of several circuit inputs, a circuit acquired by integrating common portions will be a circuit that, for any output, sequentially takes XOR only for necessary inputs (it never takes XOR with unrelated input). On the other hand, in the case of the present invention, there are cases where it takes XOR with inputs unrelated to the output (however, impact on the output is eliminated by taking XOR with the same inputs again). Such structure will never come out of mere integration of common portions of a circuit. For further details, see the description of the following embodiments.

The system performs a parallel encoding/decoding on four kinds of code, namely:

(40, 32) Reed-Solomon code (hereafter, RS1). Such that the code with an information word of 32 symbols is capable of correcting a maximum of 4 symbols errors, (38, 32) Reed-Solomon code (RS2). Capable of correcting maximum of 3 symbols errors, (36, 32) Reed-Solomon code (RS3). Capable of correcting maximum of 2 symbols errors), And (34, 32) Reed-Solomon code (RS4). Capable of correcting maximum of 1 symbol error) on GF($2^8$) of primitive polynomial $x^8+x^4+x^3+x^2+1=0$ respectively. Namely, parameters of the RS code where m=8, n=max (40, 38, 36, 34)=40, k=32. Moreover, n takes a maximum value in each code in the case of handling multiple codes of different error correction capabilities. Also, if there are x pieces of code capable of error correction, 2×symbols parities (namely, m=8 as mentioned above, 1 symbol is 8 bits=1 byte, namely 2 bytes) are required.

Also, in the case of a circuit performing parallel encoding/decoding only on a single code, or in the case of other m, n, k and primitive polynomials, the process can be implemented exactly in the same manner.

Hereafter, concrete description of the circuit (circuit diagram of gate level) is omitted, since, if the degree of parallelism is fixed, logic of the circuit is established from the matrix and can easily be implemented on the circuit by one skilled in the art. Also it is possible to implement them with a program as software.

In this code, parity generation of matrix $G_1, G_2, G_3, G_4$ of RS1, RS2, RS3, RS4 becomes the following 32×8, 32×6, 32×4, 32×2 matrix shown as Expressions 1, 2, 3 and 4.

$$G_1^T : \begin{pmatrix} \alpha^{38} & \alpha^{222} & \alpha^{83} & \alpha^{225} & & \alpha^{188} & \alpha^{43} & \alpha^{245} & \alpha^{175} \\ \vdots & \vdots & \vdots & \vdots & \cdots & \vdots & \vdots & \vdots & \vdots \\ \vdots & \vdots & \vdots & \vdots & & \vdots & \vdots & \vdots & \vdots \\ \alpha^{250} & \alpha^{111} & \alpha^{253} & \alpha^{209} & & \alpha^{71} & \alpha^{18} & \alpha^{203} & \alpha^{28} \end{pmatrix} \quad \text{Expression 1}$$

$$G_2^T : \begin{pmatrix} \alpha^{51} & \alpha^{162} & \alpha^{237} & \alpha^{16} & & \alpha^{108} & \alpha^{205} & \alpha^{228} & \alpha^{166} \\ \vdots & \vdots & \vdots & \vdots & \cdots & \vdots & \vdots & \vdots & \vdots \\ \alpha^{239} & \alpha^{43} & \alpha^{35} & \alpha^{50} & & \alpha^{248} & \alpha^{184} & \alpha^{210} & \alpha^{176} \\ \alpha^{177} & \alpha^{252} & \alpha^{31} & \alpha^{76} & & \alpha^{220} & \alpha^{243} & \alpha^{181} & \alpha^{15} \end{pmatrix} \quad \text{Expression 2}$$

$$G_3^T: \begin{pmatrix} \alpha^{140} & \alpha^{143} & \alpha^{52} & \alpha^{103} & \cdots & \alpha^{143} & \alpha^{131} & \alpha^{163} & \alpha^{75} \\ \alpha^{104} & \alpha^{97} & \alpha^{17} & \alpha^{162} & \cdots & \alpha^{49} & \alpha^{198} & \alpha^{189} & \alpha^{249} \\ \alpha^{240} & \alpha^{119} & \alpha^{29} & \alpha^{185} & & \alpha^{253} & \alpha^{162} & \alpha^{59} & \alpha^{78} \\ \alpha^{149} & \alpha^{58} & \alpha^{109} & \alpha^{0} & & \alpha^{137} & \alpha^{169} & \alpha^{81} & \alpha^{6} \end{pmatrix} \quad \text{Expression 3}$$

$$G_4^T: \begin{pmatrix} \alpha^{245} & \alpha^{10} & \alpha^{20} & \alpha^{41} & \cdots & \alpha^{113} & \alpha^{75} & \alpha^{198} & \alpha^{25} \\ \alpha^{11} & \alpha^{21} & \alpha^{42} & \alpha^{157} & & \alpha^{76} & \alpha^{199} & \alpha^{26} & \alpha^{1} \end{pmatrix} \quad \text{Expression 4}$$

Moreover, an inverted matrix is described respectively ($\alpha$ is a root of the primitive polynomial and hereafter the same). In the order from the top matrix, it is error correction capability T=4, 3, 2, 1. Moreover, parity length for error correction capability T=4 is 8 symbols (8 bytes in this embodiment); parity length when T=3 is 6 symbols (6 bytes); parity length when T=2 is 4 symbols (4 bytes); and parity length when T=1 is 2 symbols (2 bytes).

Also, parity check matrix $H_1$, $H_2$, $H_3$, $H_4$ for calculating syndrome of RS1, RS2, RS3, RS4 becomes the following 8×40, 6×38, 4×36, 2×34 matrix shown as Expression 5, 6, 7 and 8.

$$H_1: \begin{pmatrix} \alpha^{39\cdot7} & \alpha^{38\cdot7} & \alpha^{37\cdot7} & \alpha^{36\cdot7} & & \alpha^{3\cdot7} & \alpha^{2\cdot7} & \alpha^{1\cdot7} & \alpha^{0\cdot7} \\ \vdots & \vdots & \vdots & \vdots & \cdots & \vdots & \vdots & \vdots & \vdots \\ \alpha^{39\cdot1} & \alpha^{38\cdot1} & \alpha^{37\cdot1} & \alpha^{36\cdot1} & & \alpha^{3\cdot1} & \alpha^{2\cdot1} & \alpha^{1\cdot1} & \alpha^{0\cdot1} \\ \alpha^{39\cdot0} & \alpha^{38\cdot0} & \alpha^{37\cdot0} & \alpha^{36\cdot0} & & \alpha^{3\cdot0} & \alpha^{2\cdot0} & \alpha^{1\cdot0} & \alpha^{0\cdot0} \end{pmatrix} \quad \text{Expression 5}$$

$$H_2: \begin{pmatrix} \alpha^{37\cdot5} & \alpha^{36\cdot5} & \alpha^{35\cdot5} & \alpha^{34\cdot5} & & \alpha^{3\cdot5} & \alpha^{2\cdot5} & \alpha^{1\cdot5} & \alpha^{0\cdot5} \\ \vdots & \vdots & \vdots & \vdots & \cdots & \vdots & \vdots & \vdots & \vdots \\ \alpha^{37\cdot1} & \alpha^{36\cdot1} & \alpha^{35\cdot1} & \alpha^{34\cdot1} & & \alpha^{3\cdot1} & \alpha^{2\cdot1} & \alpha^{1\cdot1} & \alpha^{0\cdot1} \\ \alpha^{37\cdot0} & \alpha^{36\cdot0} & \alpha^{35\cdot0} & \alpha^{34\cdot0} & & \alpha^{3\cdot0} & \alpha^{2\cdot0} & \alpha^{1\cdot0} & \alpha^{0\cdot0} \end{pmatrix} \quad \text{Expression 6}$$

$$H_3: \begin{pmatrix} \alpha^{35\cdot3} & \alpha^{34\cdot3} & \alpha^{33\cdot3} & \alpha^{32\cdot3} & & \alpha^{3\cdot3} & \alpha^{2\cdot3} & \alpha^{1\cdot3} & \alpha^{0\cdot3} \\ \alpha^{35\cdot2} & \alpha^{34\cdot2} & \alpha^{33\cdot2} & \alpha^{32\cdot2} & \cdots & \alpha^{3\cdot2} & \alpha^{2\cdot2} & \alpha^{1\cdot2} & \alpha^{0\cdot2} \\ \alpha^{35\cdot1} & \alpha^{34\cdot1} & \alpha^{33\cdot1} & \alpha^{32\cdot1} & & \alpha^{3\cdot1} & \alpha^{2\cdot1} & \alpha^{1\cdot1} & \alpha^{0\cdot1} \\ \alpha^{35\cdot0} & \alpha^{34\cdot0} & \alpha^{33\cdot0} & \alpha^{32\cdot0} & & \alpha^{3\cdot0} & \alpha^{2\cdot0} & \alpha^{1\cdot0} & \alpha^{0\cdot0} \end{pmatrix} \quad \text{Expression 7}$$

$$H_4: \begin{pmatrix} \alpha^{33\cdot1} & \alpha^{32\cdot1} & \alpha^{31\cdot1} & \alpha^{30\cdot1} & \cdots & \alpha^{3\cdot1} & \alpha^{2\cdot1} & \alpha^{1\cdot1} & \alpha^{0\cdot1} \\ \alpha^{33\cdot0} & \alpha^{32\cdot0} & \alpha^{31\cdot0} & \alpha^{30\cdot0} & & \alpha^{3\cdot0} & \alpha^{2\cdot0} & \alpha^{1\cdot0} & \alpha^{0\cdot0} \end{pmatrix} \quad \text{Expression 8}$$

Figure 2:
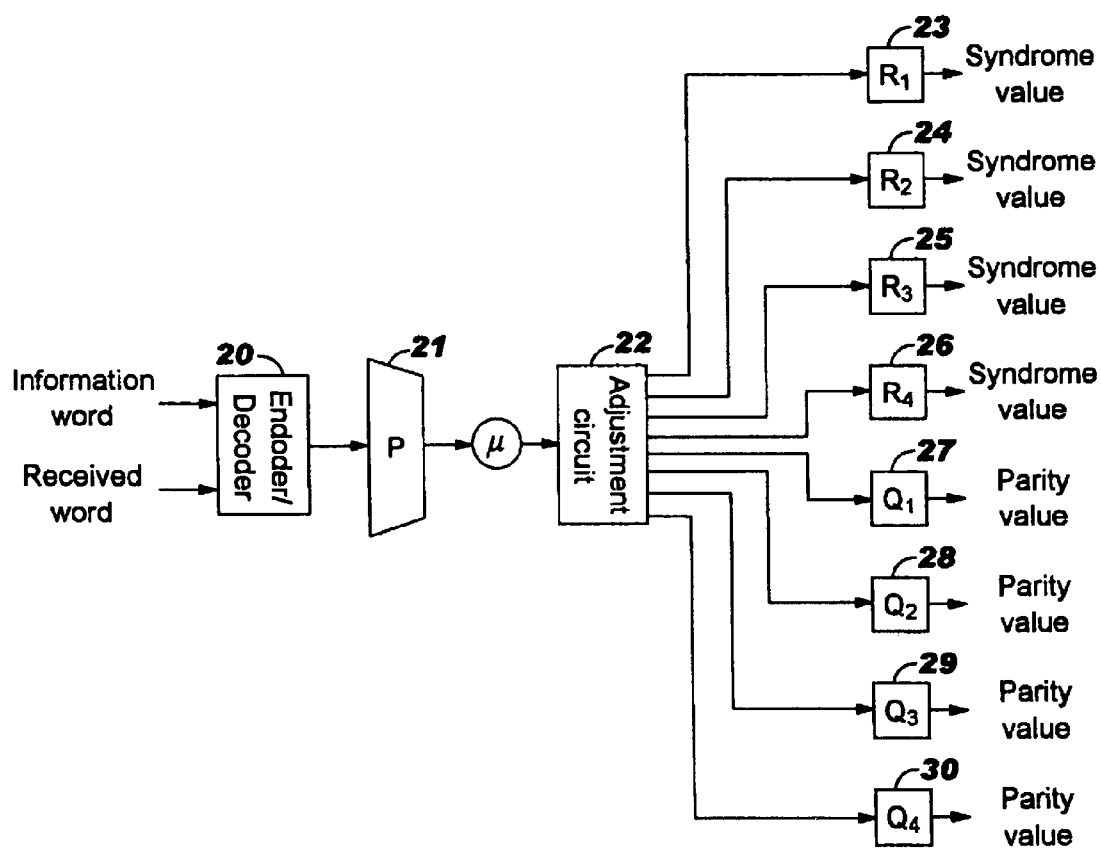
FIG. 2 is a block diagram showing the circuit of another embodiment of the present invention.

In the present invention, as shown in FIG. 2, the linear operation circuit 21 uses matrix P for acquiring intermediate signal u of bit length (n−k)m, and matrix $R_1$, $R_2$, $R_3$, $R_4$, in linear operation circuits 23, 24, 25 and 26 for acquiring syndrome of RS1, RS2, RS3, RS4 from intermediate signal u when the received word comes to a circuit input, and matrix $Q_1$, $Q_2$, $Q_3$, $Q_4$ is used in linear operation circuits 27, 28, 29 and 30 for acquiring encoding results (parity) of RS1, RS2, RS3, RS4 from intermediate signal u when the information word comes to a circuit input. Each of the circuits is implemented in a sequential circuit or combinational circuit.

Figure 3:
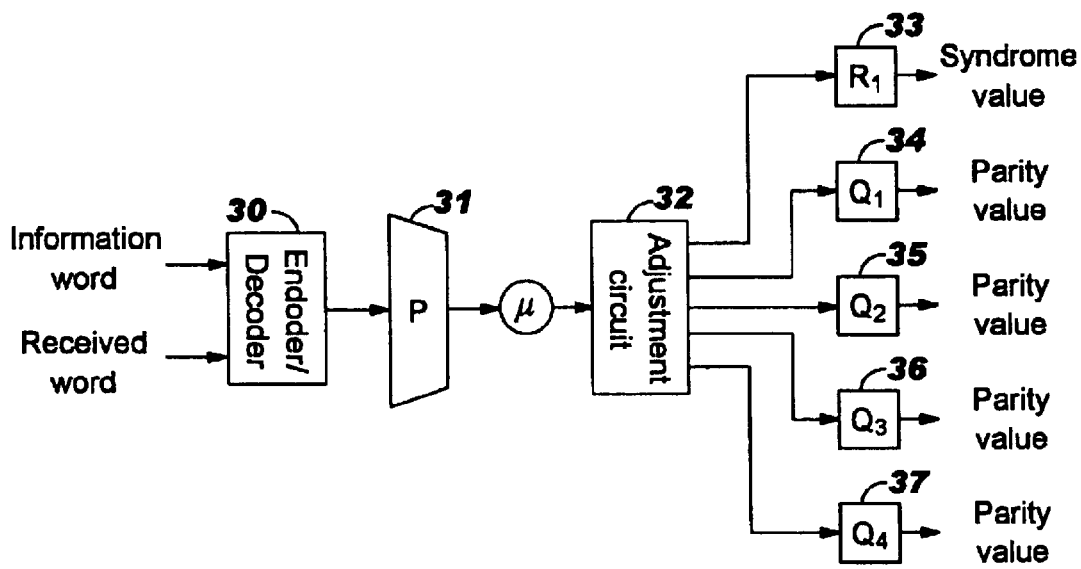
FIG. 3 is a block diagram showing the circuit of another embodiment of the present invention.

Furthermore, as $H_2$, $H_3$, $H_4$ are included in $H_1$, it is also possible, as shown in FIG. 3, to integrate $R_1$, $R_2$, $R_3$, $R_4$ as the same $R_1$ to become a single linear operation circuit 33.

P, $R_1$, $R_2$, $R_3$, $R_4$, $Q_1$, $Q_2$, $Q_3$, $Q_4$ (shown as Expressions 9 through 17 respectively) are established as follows ($R_1$ and $Q_1$ are 8×8 matrix, $R_2$ and $Q_2$ are 6×6 matrix, $R_3$ and $Q_3$ are 4×4 matrix, $R_4$ and $Q_4$ are 2×2 matrix).

$$H_3: \begin{pmatrix} \alpha^{39\cdot7} & \alpha^{38\cdot7} & \alpha^{37\cdot7} & \alpha^{36\cdot7} & & \alpha^{3\cdot7} & \alpha^{2\cdot7} & \alpha^{1\cdot7} & \alpha^{0\cdot7} \\ \vdots & \vdots & \vdots & \vdots & \cdots & \vdots & \vdots & \vdots & \vdots \\ \alpha^{39\cdot1} & \alpha^{38\cdot1} & \alpha^{37\cdot1} & \alpha^{36\cdot1} & & \alpha^{3\cdot1} & \alpha^{2\cdot1} & \alpha^{1\cdot1} & \alpha^{0\cdot1} \\ \alpha^{39\cdot0} & \alpha^{38\cdot0} & \alpha^{37\cdot0} & \alpha^{36\cdot0} & & \alpha^{3\cdot0} & \alpha^{2\cdot0} & \alpha^{1\cdot0} & \alpha^{0\cdot0} \end{pmatrix} \quad \text{Expression 9}$$

$$R_1: \begin{pmatrix} \alpha^0 & 0 & \cdots & 0 \\ 0 & \alpha^0 & & 0 \\ \vdots & \vdots & \ddots & \vdots \\ 0 & 0 & \cdots & 0 \end{pmatrix} \quad \text{Expression 10}$$

$$R_2: \begin{pmatrix} \alpha^0 & 0 & \cdots & 0 \\ 0 & \alpha^0 & & 0 \\ \vdots & \vdots & \ddots & \vdots \\ 0 & 0 & \cdots & \alpha^0 \end{pmatrix} \quad \text{Expression 11}$$

$$R_3: \begin{pmatrix} \alpha^0 & 0 & 0 & 0 \\ 0 & \alpha^0 & 0 & 0 \\ 0 & 0 & \alpha^0 & 0 \\ 0 & 0 & 0 & \alpha^0 \end{pmatrix} \quad \text{Expression 12}$$

$$R_4: \begin{pmatrix} \alpha^0 & 0 \\ 0 & \alpha^0 \end{pmatrix} \quad \text{Expression 13}$$

$$Q_1: \begin{pmatrix} \alpha^{160} & \alpha^{247} & \alpha^{134} & \alpha^{51} & \alpha^{54} & \alpha^{143} & \alpha^{7} & \alpha^{181} \\ \alpha^{247} & \alpha^{154} & \alpha^{224} & \alpha^{11} & \alpha^{31} & \alpha^{122} & \alpha^{87} & \alpha^{14} \\ \alpha^{134} & \alpha^{224} & \alpha^{124} & \alpha^{107} & \alpha^{2} & \alpha^{174} & \alpha^{129} & \alpha^{157} \\ \alpha^{51} & \alpha^{11} & \alpha^{107} & \alpha^{62} & \alpha^{55} & \alpha^{9} & \alpha^{45} & \alpha^{75} \\ \alpha^{54} & \alpha^{31} & \alpha^{2} & \alpha^{55} & \alpha^{69} & \alpha^{121} & \alpha^{32} & \alpha^{79} \\ \alpha^{143} & \alpha^{122} & \alpha^{174} & \alpha^{9} & \alpha^{121} & \alpha^{145} & \alpha^{252} & \alpha^{169} \\ \alpha^{7} & \alpha^{87} & \alpha^{129} & \alpha^{45} & \alpha^{32} & \alpha^{252} & \alpha^{189} & \alpha^{34} \\ \alpha^{181} & \alpha^{14} & \alpha^{157} & \alpha^{75} & \alpha^{79} & \alpha^{169} & \alpha^{34} & \alpha^{209} \end{pmatrix} \quad \text{Expression 14}$$

$$Q_2: \begin{pmatrix} \alpha^{219} & \alpha^{77} & \alpha^{128} & \alpha^{130} & \alpha^{83} & \alpha^{229} \\ \alpha^{77} & \alpha^{146} & \alpha^{58} & \alpha^{250} & \alpha^{56} & \alpha^{88} \\ \alpha^{128} & \alpha^{58} & \alpha^{22} & \alpha^{247} & \alpha^{0} & \alpha^{140} \\ \alpha^{130} & \alpha^{250} & \alpha^{247} & \alpha^{27} & \alpha^{68} & \alpha^{143} \\ \alpha^{83} & \alpha^{56} & \alpha^{0} & \alpha^{68} & \alpha^{161} & \alpha^{97} \\ \alpha^{229} & \alpha^{88} & \alpha^{140} & \alpha^{143} & \alpha^{97} & \alpha^{244} \end{pmatrix} \quad \text{Expression 15}$$

$$Q_3: \begin{pmatrix} \alpha^{209} & \alpha^{152} & \alpha^{153} & \alpha^{212} \\ \alpha^{152} & \alpha^{135} & \alpha^{2} & \alpha^{156} \\ \alpha^{153} & \alpha^{2} & \alpha^{138} & \alpha^{158} \\ \alpha^{212} & \alpha^{156} & \alpha^{158} & \alpha^{218} \end{pmatrix} \quad \text{Expression 16}$$

$$Q_4: \begin{pmatrix} \alpha^{230} & \alpha^{230} \\ \alpha^{230} & \alpha^{231} \end{pmatrix} \quad \text{Expression 17}$$

Here, matrix $R_1$, $R_2$, $R_3$, $R_4$ is a unit matrix on GF ($2^m$) respectively. Also, matrix $Q_1$, $Q_2$, $Q_3$, $Q_4$ is a square matrix.

The relationship between these matrices is shown below, taking $g1_i$ as a function for inserting 2i pieces of zero-symbol to the beginning of a word (higher-order side a polynomial), $g2_i$ a function for inserting 2i pieces of zero-symbol to the end of a word (lower-order side a polynomial), $f_i$ as a function for allocating a 2i symbol to the end of a word (here, i is error correction capability). Moreover, it is circuit 40 to which function $g1_i$ and function $g2_{iz}$ are applied, and it is adjustment circuit 42 to which function $f_i$ is applied.

$Q_i$ P $g2_4$=$G_1^T$ $Q_2 \; f_3 \; P \; g1_1 \; g2_3 = G^T_2$
$Q_3 \; f_2 \; P \; g1_2 \; g2_2 = G^T_3$
$Q_4 \; f_1 \; P \; g1_3 \; g2_1 = G^T_4$
$R_1 \; P = H_1$
$R_2 \; f_3 \; P \; g1_1 = H_2$
$R_3 \; f_2 \; P \; g1_2 = H_3$
$R_4 \; f_1 \; P \; g1_3 = H_4$

Figure 4:
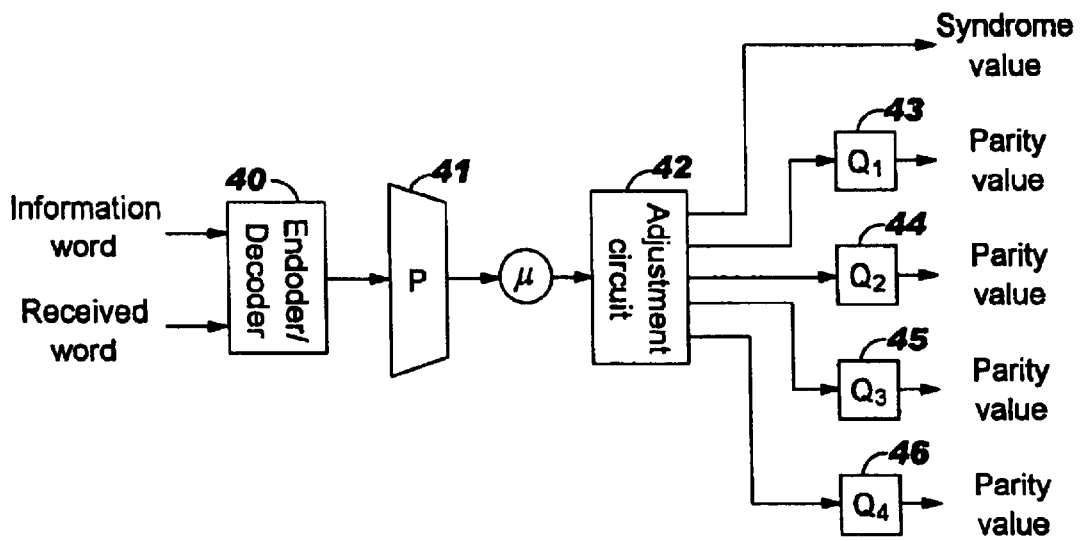
FIG. 4 is a block diagram showing the circuit of another embodiment of the present invention.

Furthermore, in this embodiment, matrix P of linear operation circuit 31 in FIG. 3 as $H_1$, linear operation circuit 33 using matrix $R_1$ becomes unnecessary, and the input is a word, intermediate signal u becomes syndrome value (see FIG. 4). In this case, it is not necessary to calculate $R_1$, $R_2$, $R_3$, $R_4$ since it is a unit matrix, and no logic gate is required.

In addition, matrix $Q_1$ can be acquired by solving the identity in Expression 18:

$$\forall x_{31}\ldots \forall x_0 [(x_{31},\ldots,x_0)G_1 = SH_1(x_{31},\ldots,x_0, 0,\ldots,0)] \quad \text{Expression 18}$$

where $x_{31},\ldots,x_0 \in GF(2^m)$ for S and considered acquired S as $Q_1$. It is the same with $Q_2$, $Q_3$, $Q_4$ except that the connected zero-vector becomes longer. Also, in general, the above identity should be solved.

However, in the case that the syndrome is calculated as matrix P, as in this embodiment, the above identity can be solved simply as follows:

First, a word that is an information word connected with 0 as fixed value is given to linear operation circuit 41 (here, a syndrome calculation circuit). Then the same value as the value acquired by substituting constant values (determined from definition of syndrome calculation) in a code word polynomial is output. From that value and the substituted constant values, a coefficient of the code word polynomial, namely a simultaneous simple equation on the parity is acquired, so the parity is acquired by solving it. Concretely, each matrix $Q_1$, $Q_2$, $Q_3$, $Q_4$ is given as an inverse matrix of the following expression (t=1 to 4) shown as Expression 19.

$$R_1: \begin{pmatrix} a^{0(2t-1)} & a^{0(2t-2)} & \cdots & a^0 \\ a^{1(2t-1)} & a^{1(2t-1)} & & a^0 \\ \vdots & \vdots & \ddots & \vdots \\ a^{(2t-1)(2t-1)} & a^{(2t-1)(2t-2)} & \cdots & a^0 \end{pmatrix} \quad \text{Expression 19}$$

Moreover, matrixes $Q_1$, $Q_2$, $Q_3$, $Q_4$, $R_1$, $R_2$, $R_3$, $R_4$ are calculations performed on GF ($2^m$), and these calculations are also performed on GF (2). Conversely, as long as the calculation is performed on GF (2), a matrix different from the above may be used to have the effect of reducing the scale of the circuit, and each calculation does not necessarily have to be performed on GF ($2^m$). This means that it can generally be regarded as a bit-level linear operation though, in this embodiment, linear operation on a symbol is considered.

While decoding is normally more complicated in processing than encoding and is apt to become a critical path, it is possible, by so establishing each matrix, to reduce the size of the circuit with the critical path remaining as is. The speed has not been reduced since the decoder itself remains intact. In addition, though the number of delay steps of the encoder increases by several, it hardly causes a practical problem considering that it is balanced by the speedup accompanying the reduced scale of the circuit.

The circuit configuration shown in the embodiment of FIG. 4 can be summarized as follows. First, by additional circuit 40, on encoding, a zero-vector is connected as a parity (generally, it is not always 0 but at least a constant value) to the end of information word $v=(v_{31}, v_{30},\ldots,v_0)$, and a zero-vector is further connected to the beginning so that the word length will become 40 symbols so as to give the acquired modified word as follows:

(1) On encoding RS1
$v'_1 = (v_{31}, v_{30},\ldots,v_0, 0, 0, 0, 0, 0, 0, 0, 0)$
(2) On encoding RS2
$v'_2 = (0, 0, v_{31}, v_{30},\ldots,v_0, 0, 0, 0, 0, 0, 0)$
(3) On encoding RS3
$v'_3 = (0, 0, 0, 0, v_{31}, v_{30},\ldots,v_0, 0, 0, 0, 0)$
(4) On encoding RS4
$v'_4 = (0, 0, 0, 0, 0, 0, v_{31}, v_{30},\ldots,v_0, 0, 0)$ On decoding, a zero-vector is connected to the beginning of received word so that the word length will become 40 symbols so as to give the acquired modified word as follows:

(5) On decoding RS1
$w_1 = (w_{39}, w_{38},\ldots,w_0)$
(6) On decoding RS2
$w_2 = (0, 0, w_{37}, w_{36},\ldots,w_0)$
(7) On decoding RS3
$w_3 = (0, 0, 0, 0, w_{35}, w_{34},\ldots,w_0)$
(8) On decoding RS4
$w_4 = (0, 0, 0, 0, 0, 0, w_{33}, w_{32},\ldots,w_0)$ Under these, first, $v'_1$ through $v'_4$ or $w_1$ through $w_4$ are given to linear operation circuit 41 to acquire concrete value of intermediate signal u. Next, u is given to adjustment circuit 42 of each matrix $Q_1$, $Q_2$, $Q_3$, $Q_4$ and linear operation circuit 43, 44, 45 and 46 to acquire value of parity. Here, depending on necessity, bit number of the intermediate signal is adjusted by adjustment circuit 42 according to bit number of sought value of parity corresponding to each linear operation circuit 43, 44, 45 and 46. Here, intermediate signal u is a word of 8 symbols, equal to the largest syndrome length. Taking it as $(s_7, s_6, s_5, s_4, s_3, s_2, s_1, s_0)$ (higher-order side is left when seen as a polynomial), the following is all, or a part of, the words to give circuits 43, 44, 45 and 46 respectively.

(9) on encoding RS1 $(s_7, s_6, s_5, s_4, s_3, s_2, s_1, s_0)$
(10) on encoding RS2 $(s_5, s_4, s_3, s_2, s_1, s_0)$
(11) on encoding RS3 $(s_3, s_2, s_1, s_0)$
(12) on encoding RS3 $(s_1, s_0)$ Adjustment circuit 42 makes these words from intermediate signal u.

Also, as mentioned above, the syndrome value is obtained from intermediate signal u. By such a circuit, correct value of parity is acquired if an information word is given to a circuit input. If a code word is given to a circuit input, a correct syndrome value is acquired.

In the case that encoding/decoding are performed in a completely parallel manner, the specific circuit size acquired under configuration of the above embodiment is as follows:
(1) Sharing between Encoder and Decoder The circuit size of an encoder alone (referring to total number of 2 input XOR) is $c_1 k(n-k)m^2$ gates where $c_1$ is a certain constant, and the circuit size of syndrome calculation alone is $c_2 n(n-k)m^2$ gates where $c_2$ is a certain constant. From this, when this technique is not used, the circuit size of an encoder and a syndrome calculation part together is $(c_1 k + c_2 n)(n-k)m^2$ $(n-k)m^2$ gates.

On the other hand, when the technique of the present invention is used, the size of circuit P is $c_3 n(n-k)nm^2$ gates, the size of circuit Q is $c_4(n-k)^2 m^2$ gates, the size of circuit R is $c_5(n-k)^2 m^2$ gates, and the total is $(c_3 n + (c_4+c_5)(n-k))(n-k)m^2$ gates where $c_3$, $c_4$ and $c_5$ are certain constants.

In general, use of this technique reduces the size of the circuit by $(3 k/2-n)(n-k)m^2$ gates since the value of each constant $c_1$ through $c_5$ is about ½ (depending on code). In normal use, it is n>k and n and k are almost equal, so this expression does not take negative value and the scale of the circuit is about ½.

2) Sharing Among Encoders

Where p pieces of encoders $E_1$ through $E_p$ of different maximum error correction capabilities are shared is considered: The information word length of $E_1$ through $E_p$ is the same, and the parity length (number of symbols) of $E_i (1 \leq i \leq p)$ is taken as $1_i$. Also, n is taken as $k+\max(1_1, \ldots, 1_p)$. At this time, the size of $E_i$ is $d_i k 1_i m^2$ taking $d_1, \ldots, d_p$ as certain constants, and the total circuit size, before applying the technique of the present invention, is as follows (Expression 20):

$$\left( k \sum_{i=1}^{p} (d_{i l_i}) \right) \cdot m^2 \qquad \text{Expression 20}$$

Utilizing the technique of the present invention, the size of a linear operation part for seeking value of intermediate signal u taking $e_0, e_1, \ldots, e_p$ as certain constants is $e_0 n(n-k) m^2$. The size of a linear operation part for seeking each parity from intermediate signal u is $e_i 1_i 2 m^2$ for $E_i$. So the total circuit size is as follows (Expression 21):

$$\left( e_0 \cdot n(n-k) + \sum_{i=1}^{p} (e_{i l_i^2}) \right) \cdot m^2 \qquad \text{Expression 21}$$

In general, since constants $d_1, \ldots, d_p, e_0, \ldots, e_p$ are about ½, the scale of the circuit is reduced by $((k1_1-k1_12)+ \ldots +(k1_p-k1_p 2)-n(n-k)m^2/2$ or so. The more the maximum error correction capability becomes (the larger the parity length becomes) the less the effect of the smaller the circuit becomes (in proportion to square), and yet the circuit is considerably reduced since it is k>>1. Practically, it is ½ or less.

(3) Specific Effects and Considerations of the Embodiment

The results are in accordance with the above (1) and (2). For example, the code used in the embodiment is as follows if the present invention is not used:
8,814 The syndrome in RS1 to RS4 are shared by general integration of common portions regardless of the present invention.
+8,040 RS1 encoder
+6,140 RS2 encoder
+4,084 RS3 encoder
+2,188 RS4 encoder
=Total 29,266 XOR gates
Moreover, one 2 input XOR is taken as one gate.

Alternatively, if the present invention is used, it is as follows (since it is matrix R=1, the size of circuit R is 0):
8,814 circuit
+1,980 circuit
+1,110 circuit
+482 circuit
+166 circuit
+0 circuit
=Total 12,552 XOR gates Accordingly, it is clear that the number of gates can be reduced by 60 percent by using the present invention.

If the present invention is not used, the larger the information word length becomes, the larger (in proportion to the word length) all the sizes of each encoder and syndrome generator become. If the present invention is used, only the size of circuit P increases making it still more advantageous.

While the technique for simplifying a circuit by using integration of common portions was referred to in the description of the background art, it can be used to further reduce the scale of each circuit by 60 percent so as to require only 5,800 gates. Here, if the present invention is not used and merely common parts are integrated, only 60 percent of the original (29,266 gates) can be reduced. Thus, this technique is effective in reducing the scale of the circuit regardless of use of integration of common portions of the circuit.

The present invention can, in a circuit having multiple encoders of different maximum error correction capability, reduce the entire scale of the circuit by allowing most of the circuit to be shared among these encoders.

It can also reduce the entire scale of the circuit combining encoders and decoders by allowing sharing by most of the encoders and most of the syndrome generator in the decoders.

Furthermore, it can hold down the extent of increase of the scale of the circuit even if information word length has increased so as to reduce the entire scale of the circuit.

What is claimed is:

1. An encoder that calculates parities of $\alpha$ (here, $\alpha$ is an integer of 2 or more) kinds of bit numbers with different error correction capability, comprising:

a first encoder/decoder circuit for generating a modified word by assigning a predetermined value to shared input information word having at least two kinds of messages;

a second circuit connected to said first circuit for generating an intermediate signal u by linear operation using said modified word and a matrix P; and a third circuit connected to said second circuit having $\alpha$ linear circuits for generating value of parity $p_1, \ldots, p_a$, each of whose bit number is different, by linear operations using all or part of the intermediate signal u and a plurality of matrixes $Q_1, \ldots, Q_a$ respectively, wherein P*Q forms a generator matrix G for each error correction.

2. The encoder according to claim 1 wherein said first circuit generates a modified word by assigning a predetermined value to an appropriate position in the shared input information word so that it will be a word of the same bit number whatever parity is generated.

3. The encoder according to claim 2, having maximum $\alpha$ adjustment circuits for adjusting the bit number of said intermediate signal corresponding to each of the third linear circuits.

4. The encoder according to claim 3, wherein said matrixes $Q_1, \ldots, Q_a$ are all square matrixes.

5. The encoder according to claim 4, wherein bit length of said predetermined value is equal to or larger than the largest bit length of said value parity $p_1, \ldots, p_a$.

6. The encoder according to claim 5, wherein said predetermined value is zero vector.

7. The encoder according to claim 6, wherein said intermediate signal is smaller in bit length than said modified word.

8. The encoder according to claim 7, wherein said linear operation is based on a Galois field or Galois extension field.

9. A circuit having a single encoder and decoder that calculates parities of $\alpha$ (here, $\alpha$ is an integer of 1 or more) kinds of bit numbers for a set of 1-dimensional linear error correction codes with different error correction capability, said circuit comprising:

a first encoder/decoder circuit for generating a modified word by inserting a predetermined value if a shared input message is an information word with at least two messages without any parity;

a second circuit connected to said first circuit for generating an intermediate signal u by a linear operation using said modified word and a matrix P;

a third circuit connected to said second circuit having α operation circuits for generating a syndrome value of $s_1, \ldots, s_a$, by a linear operation using all or part of the intermediate signal and a plurality of matrixes $R_1, \ldots, R_a$ respectively; and a fourth circuit connected to said second circuit having a linear operation circuits for generating a value of parity $p_1, \ldots, p_a$, each of whose bit number is different, by a linear operation using all or part of said intermediate signal u and a plurality of matrixes $Q_1, \ldots, Q_a$, respectively, wherein P*R forms a check matrix H and P*Q forms a generator matrix G for each linear error correction code.

10. The circuit according to claim 9, wherein said matrixes $R_1, \ldots, R_a$ are all square matrixes.

11. A circuit having a single encoder and decoder that calculates parities of α (here, α is an integer of 1 or more) kinds of bit numbers for a set of 1-dimensional linear error correction codes with different error correction capability, said circuit comprising:

a first encoder/decoder circuit for generating a modified word by assigning a predetermined value if a shared input message is an information word without any parity;

a second circuit connected to said first circuit for generating an intermediate signal u by a linear operation using said modified word and a matrix P;

a third circuit connected to said second circuit having a plurality of syndrome circuits for generating a syndrome value of $s_1, \ldots, s_a$ by linear operation using all or part of said intermediate signal u and a plurality of matrixes R; and a fourth circuit connected to said second circuit having circuits for generating a value of parity $p_1, \ldots, p_a$ each of whose bit number is different, by linear operation using all or part of said intermediate signal u and a plurality of matrixes $Q_1, \ldots, Q_a$ respectively wherein P*Q forms a generator matrix G for each of the error correction codes and P*R forms a check matrix H that calculates the syndrome value of $s_1, \ldots, s_a$.

12. The circuit according to claim 11, having an adjustment circuit for adjusting bit number of said intermediate signal corresponding to the third or fourth circuit.

13. A circuit having a single encoder and decoder capable of calculating parities of α (here, α is an integer of 1 or more) kinds of bit numbers for a set of 1-dimensional linear correction codes with different error correction capability, said circuit comprising:

a first encoder/decoder circuit for generating a modified word by assigning a predetermined value if shared input message is an information word without any parity;

a second circuit connected to said first circuit for generating an intermediate signal by a linear operation using said modified word and a matrix P, said intermediate signal having a syndrome value of $s_1, \ldots, s_a$ if said input message is a received word; and a third circuit connected to said second circuit having α operation circuits for generating a value of parity $p_1, \ldots, p_a$, each of whose bit number is different, by linear operation using all or part of said intermediate signal and a plurality of matrixes $Q_1, \ldots, Q_a$ respectively wherein P*Q forms a generator maxtrix G for each of said linear correction codes.

14. The circuit according to claim 13, having an adjustment circuit for adjusting a bit number of said intermediate signal corresponding to the third circuit.

15. The circuit according to claim 14 wherein said first circuit, when the information word or received word has a bit number which is less than received a word of a larger length is input, generates a modified word by assigning a predetermined value to an appropriate position in such word so that it will be a word of the same bit number.

16. The circuit according to claim 15, wherein said matrixes $Q_1, \ldots, Q_a$ are all square matrixes.

17. The circuit according to claim 16, wherein bit length of said predetermined value is equal to or larger than the largest bit length of said value of parity $p_1, \ldots, p_a$.

18. The circuit according to claim 17, wherein said predetermined value is zero vector.

19. The circuit according to claim 18, wherein said intermediate signal is smaller in bit length than said modified word.

20. The circuit according to claim 19, wherein said linear operation is linear operation on Galois field or Galois extension field.

21. A method of generating parities of α (here, α is an integer of 2 or more) kinds of bit numbers with different error correction capability, comprising the steps of:

sharing input information with encoding and decoding circuits;

generating a modified word by inserting a predetermined value to input information word;

generating an intermediate signal u by a linear operation using said modified word and a matrix P; and generating a value of parity $p_1, \ldots, p_a$, each of whose bit number is different, by a linear operation using all or part of the intermediate signal and a plurality of matrixes $Q_1, \ldots, Q_a$ respectively.

22. A storage medium for storing a program for generating parities of α (here, α is an integer of 2 or more) kinds of bit numbers with different error correction capability, said program comprising the steps of:

sharing input information with encoding and decoding circuits;

generating a modified word by assigning a predetermined value to input information word;

generating an intermediate signal u by a linear operation using said modified word and a matrix P; and generating a value of parity $p_1, \ldots, p_a$, each of which is a different bit number, by a linear operation using all or part of the intermediate signal and a plurality of matrixes $Q_1, \ldots, Q_a$ respectively.

\* \* \* \* \*